United States Patent
Zierdt

(10) Patent No.: US 8,843,098 B2
(45) Date of Patent: Sep. 23, 2014

(54) RECONSTRUCTION FILTER WITH BUILT-IN BALUN

(75) Inventor: Michael G. Zierdt, Hillsborough, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 314 days.

(21) Appl. No.: 13/157,379

(22) Filed: Jun. 10, 2011

(65) Prior Publication Data

US 2012/0314734 A1   Dec. 13, 2012

(51) Int. Cl.
*H04B 1/10* (2006.01)
*H03H 7/01* (2006.01)
*H03F 3/217* (2006.01)
*H03H 7/42* (2006.01)
*H03H 1/00* (2006.01)

(52) U.S. Cl.
CPC ............ *H03F 3/2176* (2013.01); *H03H 7/175* (2013.01); *H03H 2001/0085* (2013.01); *H03H 7/0115* (2013.01); *H03H 7/1775* (2013.01); *H03H 7/422* (2013.01)
USPC .......................................... 455/284; 455/307

(58) Field of Classification Search
USPC ................. 455/302, 304, 307, 284, 286, 306; 333/176, 186, 187, 189, 190
See application file for complete search history.

(56) References Cited

U.S. PATENT DOCUMENTS

| | | | |
|---|---|---|---|
| 6,373,168 B1 * | 4/2002 | Gamo | 333/186 |
| 6,850,747 B1 * | 2/2005 | Imbornone et al. | 455/307 |
| 2010/0073106 A1 * | 3/2010 | Stuebing et al. | 333/187 |

OTHER PUBLICATIONS

Maier, S. et al., 900 MHz Pulse-Width-Modulated Class-S Power Amplifier with Improved Linearity, Labs Germany, Stuttgart, Germany, [2]Fraunhofer Institute Applied Solid-State Physics (IAF), Freiburg, Germany, [3]Alcatel-Lucent Bell Labs USA, Murray Hill, United States Power Point Presentation dated Jun. 8, 2011.

* cited by examiner

*Primary Examiner* — Lana N Le
(74) *Attorney, Agent, or Firm* — Davidson Sheehan, LLP

(57) ABSTRACT

The present invention provides a filter that may be used as a reconstruction filter with a built-in balun. One embodiment of the filter includes first and second input nodes for receiving balanced radiofrequency signals and an inductive-capacitive (LC) circuit coupled between the first and second input nodes and first and second intermediate nodes. This embodiment of the filter also includes a coupling circuit that couples the first and second intermediate nodes to an output node. Balanced signals within a filter bandwidth are transmitted from the first and second input nodes to the output node and balanced signals outside the filter bandwidth are substantially shorted to ground.

5 Claims, 10 Drawing Sheets

RECONSTRUCTION FILTER WITH BUILT-IN BALUN

BACKGROUND OF THE INVENTION

1. Field of the Invention

This invention relates generally to filtering and, more particularly, to filters used in wireless communication systems.

2. Description of the Related Art

Base stations and user equipment in wireless communication systems typically communicate over the air interface by exchanging radiofrequency signals. Conventional base stations are often required to transmit signals with sufficient power to be detected and decoded by user equipment at distances that can exceed several kilometers. The base stations therefore implement power amplifiers to amplify signals for transmission using antennas coupled to the base station. Designers have been attempting to reduce power consumption in radio communication hardware and much attention has been focused on amplifiers.

Amplifiers are typically relatively inefficient. For example, conventional Class-A amplifiers can amplify typical Third Generation (3G) radiofrequency signals at efficiencies of less than 25% so that more than 75% of the power consumed by the Class-A amplifiers is wasted, e.g., by being dissipated as heat. The efficiency of amplifiers used in radio frequency communication can be improved by applying high efficiency linearity schemes including pre-distortion, Doherty designs, Envelope Tracking-Drain Modulation, linear amplification using nonlinear components (LINC), and the like. For example, Doherty designs use a second output stage as a peak amplifier to lift efficiency from the typical 15% up to 40-50% in a narrow to moderate bandwidth. For another example, Envelope Tracking designs can achieve efficiencies of up to 60% for narrow band signals by modulating the supply voltage to the amplifier in line with the envelope of the signal.

Class-S amplifiers can also operate in principle at very high efficiencies. In a Class-S amplifier, a digital representation of the transmitted signal is applied to inputs of a high power switching amplifier. The switching amplifier alternates between two states in response to the input digital signal. For example, the switching amplifier can alternate between a high current/no voltage state and a high-voltage/no current state. Class-S systems can be implemented as voltage switching or current switching systems. Theoretically, the Class-S amplifier can achieve 100% efficiency because the power dissipated in the amplifier is proportional to the product of the current and the voltage. Since either the current or the voltage is zero in both states, no power is dissipated and the amplifier operates at 100% efficiency. However, actual implementations of Class-S amplifiers operate at less than ideal efficiencies, at least in part because of difficulties associated with manipulating Giga-bit per second digital signals and resistive losses in the switching device.

Converting an analog signal to a digital signal introduces quantization noise artifacts and/or clock spurs at frequencies above and below the bandwidth of the input analog signal. Class-S amplifiers also amplify the high and low frequency quantization noise and/or clock spurs because they amplify the digital signal. Reconstruction filters are therefore added to the Class-S amplifier to filter out the noise before the amplified signal is applied to the antenna port. Conventional filters create a high reflection coefficient impedance to reflect the high and low frequency noise and thereby prevent noise from reaching the antenna port. Using an arbitrary topology reflection filter may decrease the efficiency of the amplifier by increasing the energy dissipated within the amplifier especially since these signals have a great deal of their total power spread over the entire frequency spectrum. For example, high-speed switching amplifiers that can operate at the gigahertz frequencies required for radiofrequency communication can be implemented using gallium nitride (GaN) field effect transistors. Energy can be dissipated in the channel region of these transistors and this channel loss can be exacerbated when noise is reflected from the reconstruction filter back into the switch.

SUMMARY OF EMBODIMENTS OF THE INVENTION

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a filter is provided that may be used as a reconstruction filter with a built-in balun. One embodiment of the filter includes first and second input nodes for receiving balanced signals and an inductive-capacitive (LC) circuit coupled between the first and second input nodes and first and second intermediate nodes. This embodiment of the filter also includes a coupling circuit that couples the first and second intermediate nodes to an output node. Balanced signals within a filter bandwidth are transmitted from the first and second input nodes to the output node and balanced signals outside the filter bandwidth are substantially shorted to ground.

In another embodiment, an amplifier is provided. One embodiment of the amplifier includes a modulator configured to convert an analog signal into first and second balanced digital signals and first and second switching amplifiers for amplifying the first and second balanced digital signals, respectively. This embodiment of the amplifier also includes a filter that includes first and second input nodes for receiving the first and second balanced digital signals, respectively, and an inductive-capacitive (LC) circuit coupled between the first and second input nodes and first and second intermediate nodes. The filter also includes a coupling circuit that couples the first and second intermediate nodes to an output node. Balanced signals within a filter bandwidth are transmitted from the first and second input nodes to the output node and balanced signals outside the filter bandwidth are substantially shorted to ground so that an amplified version of the analog signal is presented by the output node.

In yet another embodiment, a base station is provided. One embodiment of the base station includes an amplifier configured to convert an analog signal into first and second balanced digital signals and to amplify the first and second balanced digital signals, respectively. This embodiment of the amplifier also includes a filter that includes first and second input nodes for receiving the first and second balanced digital signals, respectively, and an inductive-capacitive (LC) circuit coupled between the first and second input nodes and first and second intermediate nodes. The filter also includes a coupling circuit that couples the first and second intermediate nodes to an output node. Balanced signals within a filter bandwidth are transmitted from the first and second input nodes to the output node and balanced signals outside the filter bandwidth are substantially shorted to ground so that an amplified version of the analog signal is presented by the output node. This embodiment of the base station also includes an antenna coupled to the output node to receive the amplified version of the analog signal

BRIEF DESCRIPTION OF THE DRAWINGS

The disclosed subject matter may be understood by reference to the following description taken in conjunction with the accompanying drawings, in which like reference numerals identify like elements, and in which.

Figure 1:
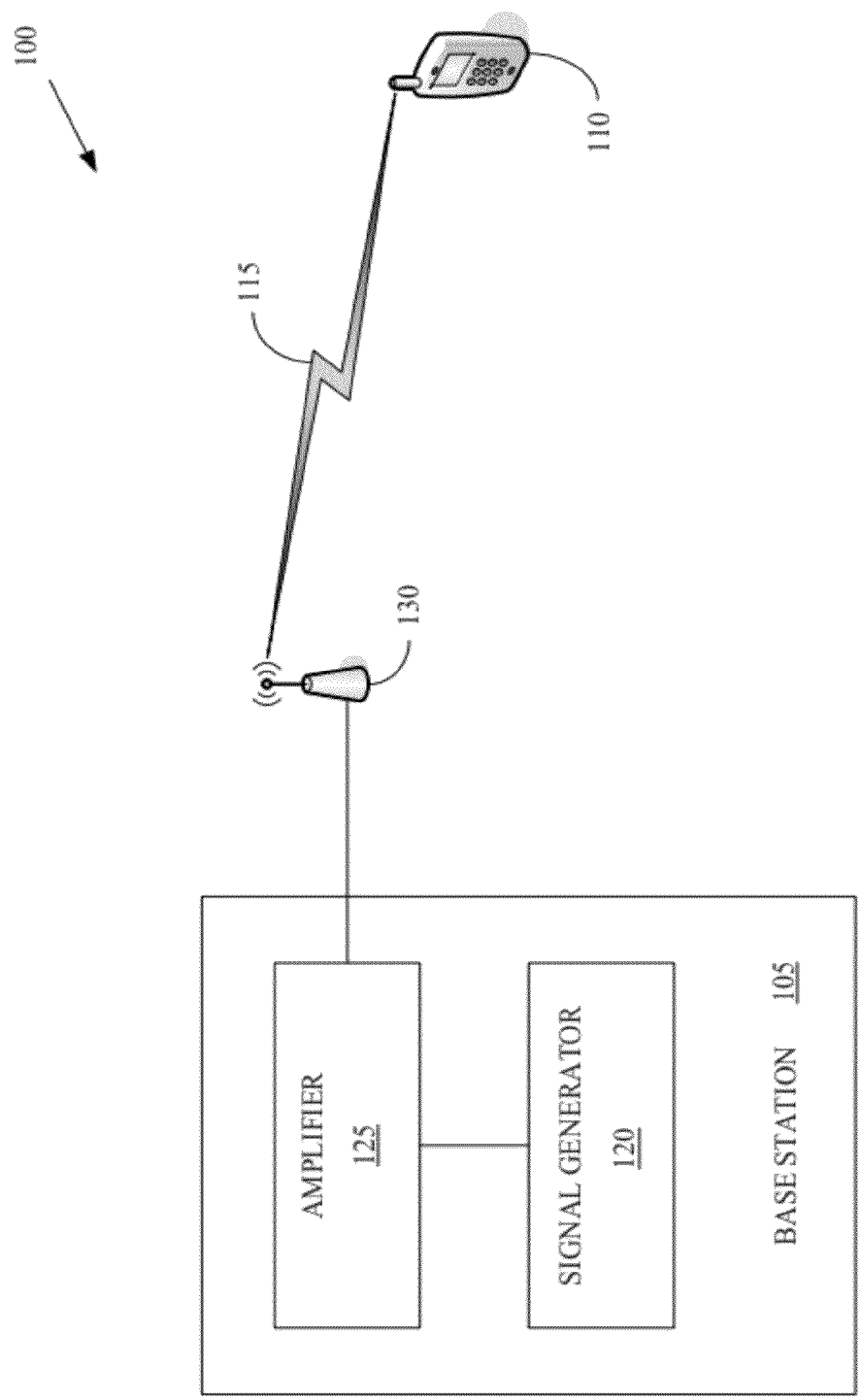
FIG. 1 conceptually illustrates one exemplary embodiment of a wireless communication system.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present application describes embodiments of a filter that may be used as a reconstruction filter in high-efficiency, amplifiers such as Class-S amplifiers. Exemplary embodiments of these amplifiers can divide an input analog signal into two branches that are independently amplified before being recombined to generate the amplified output signal. For example, a delta-sigma modulator may be used to convert the analog signal into a pair of balanced digital signals that are then amplified by a pair of switching amplifiers. A reconstruction filter is used to remove out-of-band quantization noise or clock spurs created by digitizing the input signal and to transmit an amplified version of the analog input signal. For Class-S operation in a current switching mode, the reconstruction filter should have a balanced 2-port input to receive the signals from the two amplifier branches and a single port output to connect to an antenna or another filter stage, e.g., when the amplifier is used to amplify radiofrequency signals transmitted by base stations in wireless communication systems.

Conventional filters use a high-reflection-coefficient impedance to reflect out-of-band signals. However, if conventional filters were used as a reconstruction filter, they would reflect a portion of the out-of-band noise back into the amplifier, which may exacerbate dissipation in the filter if an arbitrary topology is chosen, thereby reducing the efficiency of the amplifier. To mitigate this, reconstructions filters for switching mode class-S may use a very specific topology that presents the switching device with an RF short for the portions of the spectrum that are rejected. In addition, requiring a filter with a balanced input port and a single output port requires a balun function. A balun is defined herein in accordance with common usage in the art as a circuit that transforms differential signal pairs into single-ended signal circuits. Baluns may also be referred to as balanced-to-unbalanced transformers. If this function is not designed into the filter it takes up extra space, as well as adding cost and insertion loss to the overall design.

At least in part to address these drawbacks in the conventional practice, the present application describes embodiments of a filter that transmits a bandwidth centered on a selected frequency and shorts frequencies outside of the bandwidth to ground at the reference plane of the filter input while also integrating a balun function by leveraging the transmission line implementation of at least one of the inductors in the design. By shorting the out-of-band frequencies to ground, the amount of energy created at these frequencies is reduced or eliminated and therefore this energy does not have a chance to dissipate in the resistive portion of the non-ideal switches. Consequently, the relatively high efficiency characteristics of the amplifier are preserved. One embodiment of the filter includes two input ports and an inductive-capacitive (LC) circuit. A coupling circuit that leverages the transmission line implementation of at least one of the inductors is used as a balun so that balanced signals provided to the two input ports are filtered and provided to a single output port. The LC parameters of the filter can be adjusted or tuned so that radiofrequency signals within a filter bandwidth are transmitted to the output port and balanced radiofrequency signals outside the filter bandwidth are substantially shorted to ground.

FIG. 1 conceptually illustrates one exemplary embodiment of a wireless communication system 100. In the illustrated embodiment, a base station 105 is used to provide wireless connectivity to one or more mobile units 110 over an air interface 115. The air interface 115 may support various uplink and/or downlink channels that are implemented according to various wireless communication standards and/or protocols. For example, communication over the air interface 115 may be performed according to standards and/or protocols defined by the Third Generation Partnership Project (3GPP). However, persons of ordinary skill in the art having benefit of the present disclosure should appreciate that the particular standards and/or protocols used for communication over the air interface 115 are matters of design choice. Alternative embodiments of the wireless communication system 100 may use other standards, protocols, and/or combinations thereof. Persons of ordinary skill in the art having benefit of the present disclosure should also appreciate that alternative embodiments of the wireless communication system may use other wireless communication devices such as access points, access routers, base station routers, base transceiver stations, eNodeBs, and the like.

The base station 105 includes a signal generator 120 that may be used to generate signals for transmission over the air interface 115. In one embodiment, the signal generator 120 includes functionality for encoding and/or modulating signals that are intended to be transmitted over the air interface 115. The signal generator 120 may then provide the signal to an amplifier 125 that is configured to amplify signals and provide the amplified signals to an antenna 130 for transmission over the air interface 115. In one embodiment, the amplifier 125 is configured to convert an analog signal into a pair of balanced digital signals and then amplify the first and second balanced digital signals. The pair of amplified balanced digital signals can then be provided to input nodes of a reconstruction filter (not shown in FIG. 1). One exemplary embodiment of the reconstruction filter may include an inductive-capacitive (LC) circuit and a coupling circuit that couples two nodes of the LC circuit to an output node. In various embodiments, the electromagnetic coupling of the nodes may include inductive and/or capacitive portions. The reconstruction filter selectively filters the amplified digital signals so that signals within a filter bandwidth are transmitted to the output node and signals outside the filter bandwidth are substantially shorted to ground so that an amplified version of the analog signal is presented by the output node. Persons of ordinary skill in the art having benefit of the present disclosure should appreciate that actual implementations of the reconstruction filter may not perfectly short out-of-band signals to ground, e.g., because of parasitic detuning and losses of the non-ideal lumped elements and transmission lines. The term "substantially shorted" is therefore intended to account for these imperfections and to indicate that the short prevents to a great extent the creation of out-of-band signal energy at the switching device.

Figure 2:
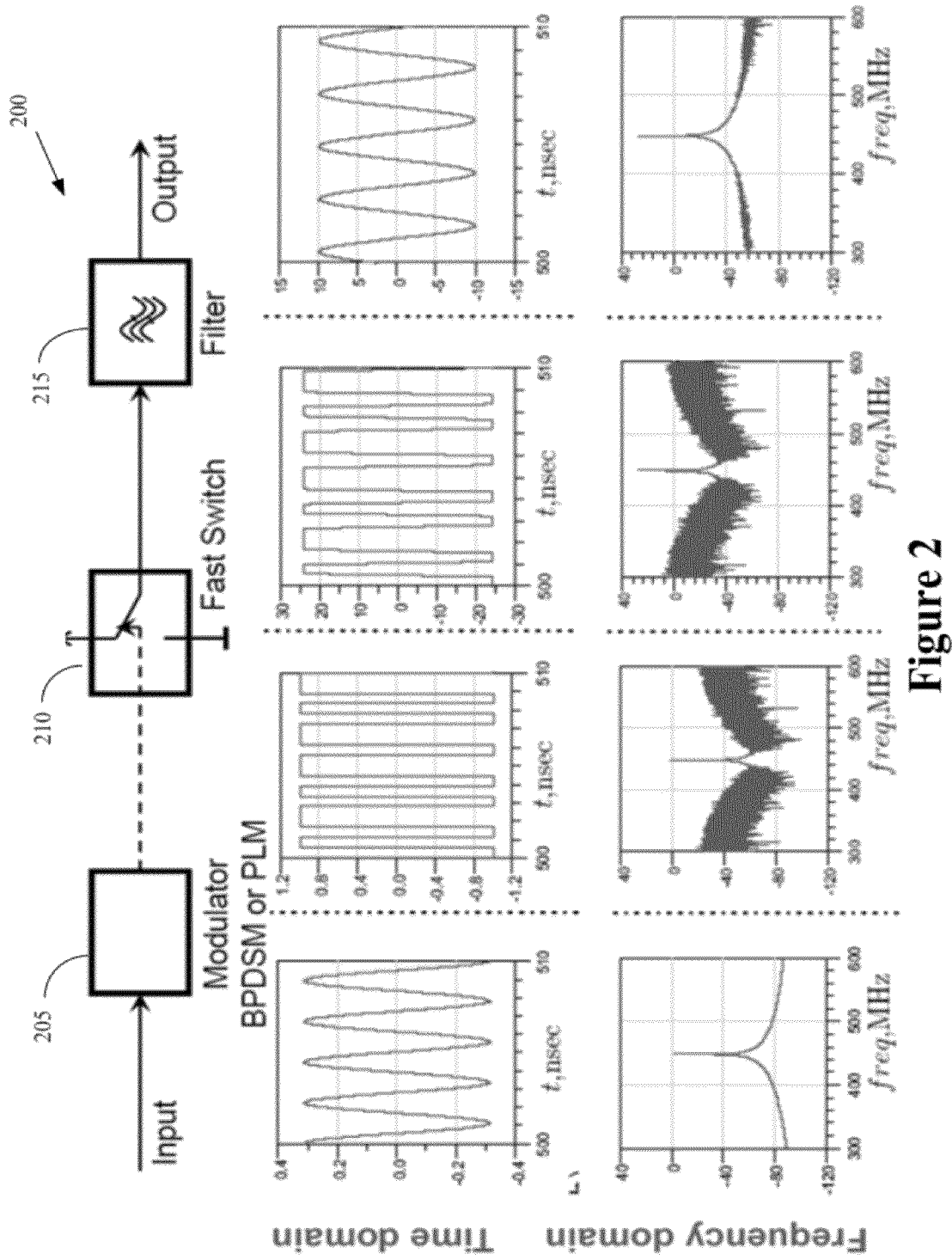
FIG. 2 conceptually illustrates a first exemplary embodiment of a Class-S amplifier.

FIG. 2 conceptually illustrates a first exemplary embodiment of an amplifier 200. In the illustrated embodiment, the amplifier 200 includes a modulator 205, a switch 210, and a filter 215. For example, the modulator 205 may be a band-pass delta-sigma modulator (BPDSM), a pulse width modulator (PWM), or a pulse length modulator (PLM), the switch 210 may be a fast switching element formed using gallium-nitride field effect transistor technology, and the filter 215 may be a reconstruction filter that operates according to embodiments of the techniques described herein. The graphs below the elements of the amplifier 200 depict exemplary embodiments of signals at different stages along the signal path within the amplifier 200. The upper sequence shows the signals plotted in the time domain as a function of time (in nanoseconds) and the lower sequence shows the signals plotted in the frequency domain as a function of the frequency (in megahertz, MHz).

An input signal is provided to the modulator 205. In the illustrated embodiment, the input signal has a sharp peak at approximately 450 MHz, which may correspond to an RF signal frequency of a transmitter such as a base station transmitter. The sharp peak in the input signal is clearly seen in the frequency domain and corresponds to an approximate sine wave when depicted in the time domain. The modulator 205 converts the analog input signal into a digital signal that is represented by an approximately square wave that switches between two amplitudes when viewed in the time domain. In the frequency domain, the signal retains the peak at 450 MHz but digitization of the analog signal introduces quantization noise in the upper and lower out-of-band frequencies. For example, significant noise can be seen at frequencies below approximately 440 MHz and above approximately 480 MHz. The switch 210 switches between two states in response to the digital signal provided by the modulator 205. The switch 210 amplifies the input square wave so that the amplitude of the square wave increases, as seen in the time domain. In the frequency domain, both the signal in the band around 450 MHz and the out-of-band noise are amplified by the switch 210. The filter 215 filters the out-of-band noise by shorting this frequency range to ground. The filter 215 has a low insertion loss in its pass-band and therefore transmits the amplified version of the input signal. In the time domain, the amplified signal is therefore approximately a sine wave at the frequency 450 MHz having a larger amplitude than the input sine wave. In the frequency domain, the amplified signal appears as a signal with a strong peak at 450 MHz and an amplitude that is larger than the input signal amplitude.

Figure 3:
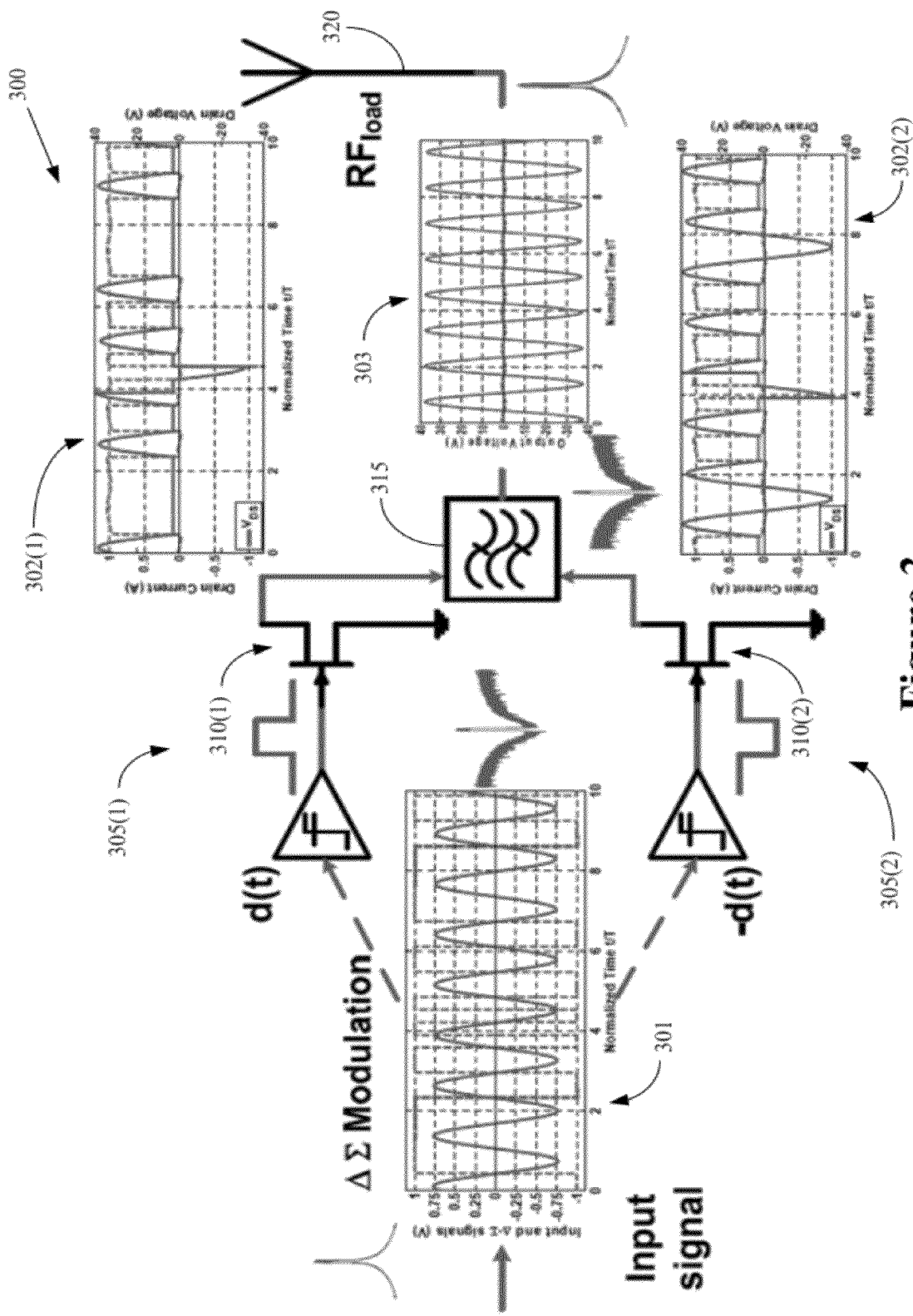
FIG. 3 conceptually illustrates a second exemplary embodiment of a Class-S amplifier.

FIG. 3 conceptually illustrates a second exemplary embodiment of an amplifier 300. In the illustrated embodiment, delta-sigma ($\Delta$-$\Sigma$) modulation is performed on an analog input signal 301 to create a balanced pair of digital signals (d(t), −d(t)) that are provided to a pair of switching amplifiers 305. The amplifiers 305 include transistor elements 310 that may be formed using Ga—N field effect transistor technology. The switching amplifiers 305 provide the amplified digital signal 302 to input ports of a reconstruction filter 315, which filters out the out-of-band noise and provides the filtered and amplified signal 303 to a radiofrequency load 220 such as an antenna of a base station or other transmitter.

Figure 4:
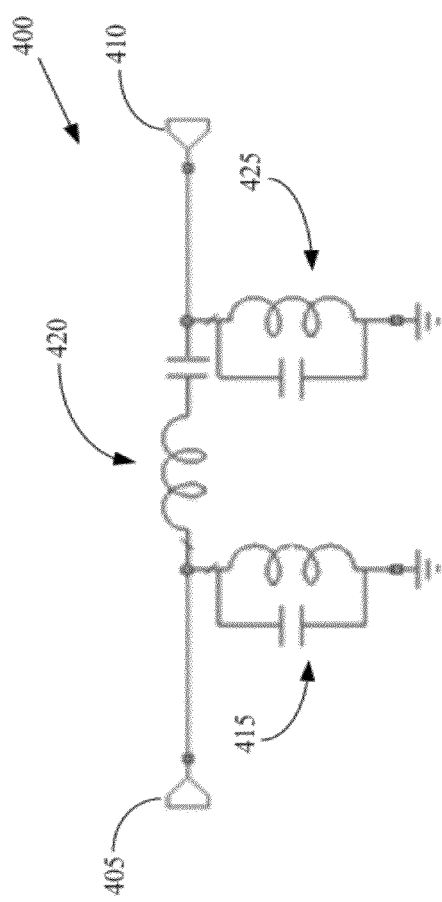
FIG. 4 conceptually illustrates a first exemplary embodiment of an inductive-capacitive (LC) filter.

FIG. 4 conceptually illustrates a first exemplary embodiment of an inductive-capacitive (LC) filter 400. In the illustrated embodiment, the filter 400 uses a single input port 405 and a single output port 410. A shunt LC resonator 415 is coupled between the input port 405 and ground. The shunt LC resonator 415 is formed of a capacitor and an inductor coupled in parallel. A series LC resonator formed of a capacitor and an inductor is coupled in series between the input port 405 and the output port 410, and an additional shunt LC resonator 425 is coupled between the output port 410 and ground. Persons of ordinary skill in the art having benefit of the present disclosure should appreciate that the filter 400 can be converted into a balanced filter having two input ports and two output ports by halving the capacitances of the shunt capacitors, doubling the inductances of the shunt inductors, and mirroring the series LC resonator 420 between the additional input and output ports.

The LC filter 400 has a number of disadvantages. For example, the LC filter 400 requires an additional balun to convert the input port to a two port balanced input while maintaining the termination requirements of an RF short at the plane of the filter input. Furthermore, the different inductors and capacitors in the filter 400 may have a wide range of inductances and/or capacitances, e.g., values that range over more than one order of magnitude, when the filter 400 is used to filter radiofrequency signals. Wide ranges of inductances and/or capacitances may not be realizable using conventional chip fabrication technology or exhibit undesirable parasitic responses.

Figure 5:
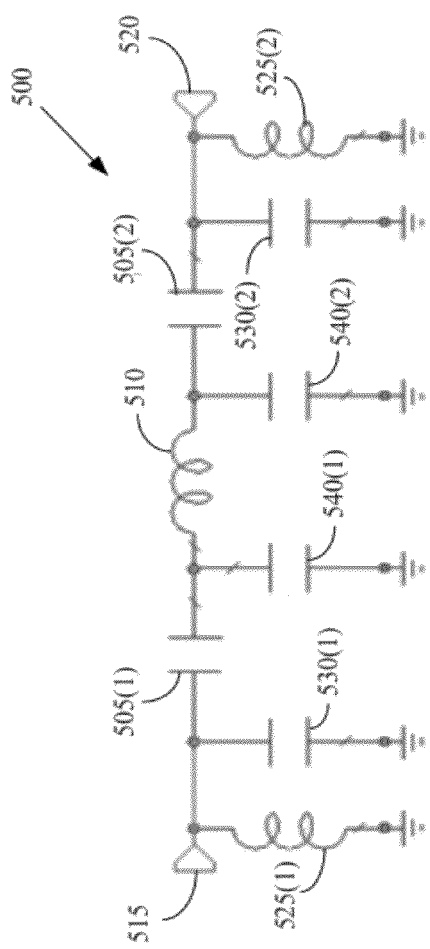
FIG. 5 conceptually illustrates a second exemplary embodiment of an LC filter.

FIG. 5 conceptually illustrates a second exemplary embodiment of an LC filter 500. In the illustrated embodiment, the LC filter 500 may correspond to a Norton Transformation of the filter 400 shown in FIG. 4 to the topology of the LC filter 500 depicted in FIG. 5. The LC filter 500 is formed using a shunt LC resonator on each end of the filter that includes capacitors 530 and an inductor 525. Capacitors 505, 540 are positioned between the two shunt resonators to transform the filter termination impedances to values that resonate with the series inductor 510. Embodiments of the filter 500 can be realized using a smaller range of inductances and/or capacitances and so embodiments of the filter 500 may be easier to realize using multichip capacitors. In one embodiment, a balanced version of the LC filter 500 may be created by halving the capacitances of the shunt capacitors, doubling the inductances of the shunt inductors, and mirroring the series LC resonator between the additional input and output ports. The LC filter 500 typically requires an additional balun to provide a single output node. However, adding a balun after the filter 500 also adds space, cost, and insertion loss to the overall design.

Figure 6:
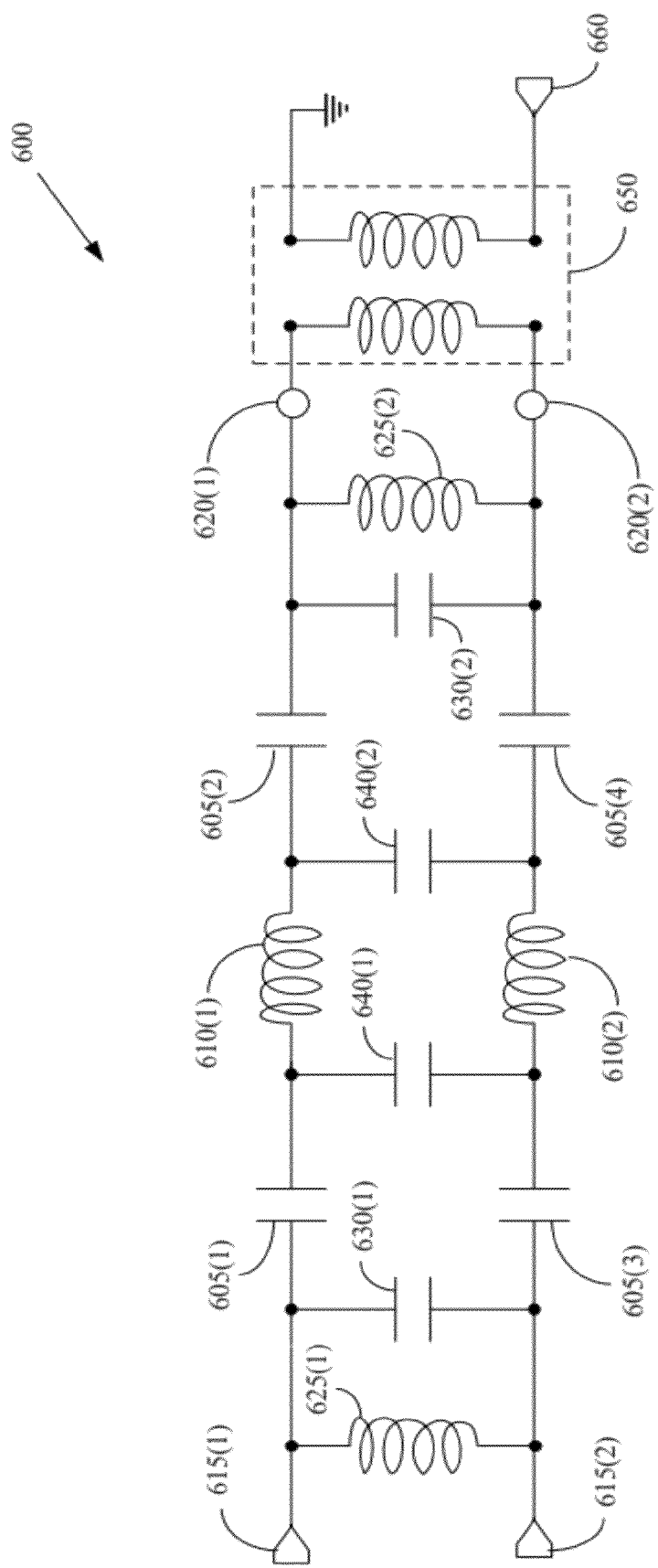
FIG. 6 conceptually illustrates a third exemplary embodiment of an LC filter.

FIG. 6 conceptually illustrates a third exemplary embodiment of an LC filter 600. In the illustrated embodiment, the LC filter 600 is formed using a pair of shunt LC resonators that each includes a capacitor 630 and an inductor 625. The filter 600 also includes a transformer 650 that couples intermediate balanced nodes 620 with the output node 660, which effectively performs a balun function by converting the balanced two-port filter output to a one-port unbalanced output. In the illustrated embodiment, series capacitors 605 and shunt capacitors 640 transform and resonate with series inductors 610. In some embodiments, the transformer 650 may introduce parasitic non-idealities when the filter 600 is used to filter signals at RF frequencies.

Figure 7:
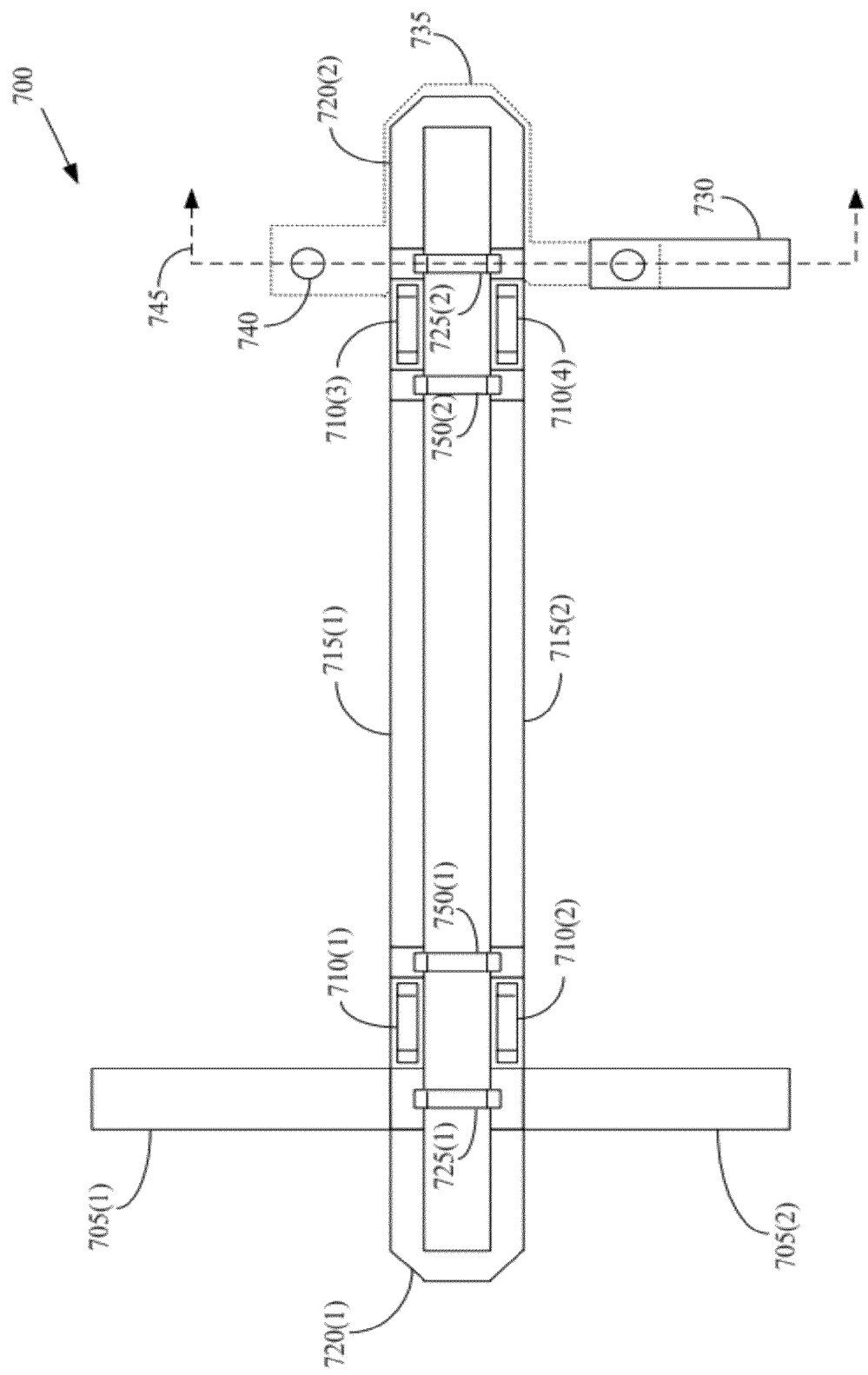
FIG. 7 conceptually illustrates a fourth exemplary embodiment of a hybrid microstrip/LC filter.

FIG. 7 conceptually illustrates a fourth exemplary embodiment of an LC filter 700. In the illustrated embodiment, the filter 700 is formed on a substrate such as a multilayer printed circuit board, as discussed herein. The filter 700 includes input lines 705 that are formed of metal traces that are deployed on the substrate. The input lines 705 are configured to receive signals such as balanced radiofrequency signals. Each input line 705 as well as the output line 730 is electrically coupled to a shunt LC resonator that is formed of shunt capacitors 725 and an inductive element 720 that is formed of a metal trace. Series capacitors 710, shunt capacitors 750, and series inductors 715 that are formed by a metal trace are electrically coupled between the shunt LC resonators. In one embodiment, the capacitors 710, 725, 750 may be ceramic multilayer capacitors and the inductive elements 715, 720 may be transmission lines in the form of micro-strips, strip lines, suspended substrate strip lines, and the like. The inductances and/or capacitances can be varied or tuned by adjusting the dimensions and/or materials used to form the capacitors and the inductive elements. In alternative embodiments, one or more of the inductors 715, 720 may be formed using other types of inductors such as chip inductors.

The LC filter 700 includes a coupling circuit that couples the two branches of the filter to a single output node 730. In the illustrated embodiment, the coupling circuit includes a coupling element 735 that is deployed beneath the shunt inductor 720(2). For example, the coupling element 735 may be a metal trace that is formed in a layer of the substrate below the layer that includes the shunt inductors 720(2). A transmission line, a microstrip line, a strip line, a suspended substrate strip line, and the like may be used to form the coupling element 735. The vertical separation of the inductor 720(2) and the coupling element 735 may be determined by the thickness of one or more of the layers of the substrate. The coupling element 735 may be directly grounded on one end by via 740 or virtually grounded. For example, via 740 could be replaced by a 90° transmission line transformer that has an open end to create an effective ground. Although the embodiment shown in FIG. 7 deploys the inductive element 720(2) and the coupling element 735 in an over-under arrangement separated by a vertical distance, persons of ordinary skill in the art having benefit of the present disclosure should appreciate that other arrangements may also be used. For example, in an alternative embodiment, the inductive element 720(2) and the coupling element 735 may be deployed in the same layer of the substrate with a horizontal separation. The element 720(2) and the coupling element 735 function as a built-in balun to convert the filter 700 from a balanced two-port input to an unbalanced one-port output. Furthermore, persons of ordinary skill in the art having benefit of the present disclosure should appreciate that other similar coupling circuits may be used to form the built-in balun. For example, a coupling element may be deployed adjacent to one or more of the other inductors (for example 715) in either an over-under or horizontally separated arrangement to form the coupling circuit.

Figure 8:
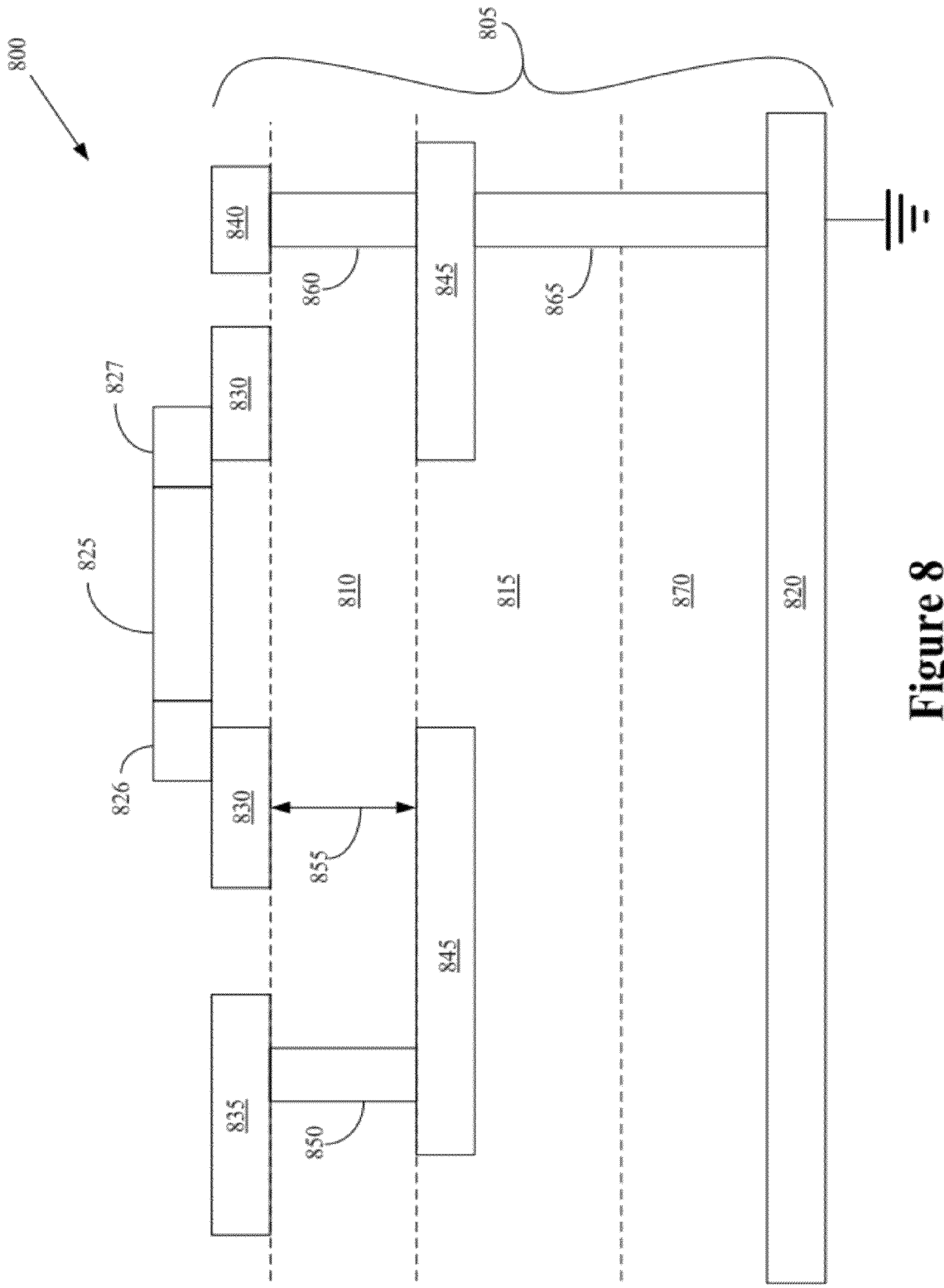
FIG. 8 conceptually illustrates a cross-sectional view of the hybrid microstrip/LC filter depicted in FIG. 7.

FIG. 8 conceptually illustrates a cross-sectional view 800 of the filter 700 depicted in FIG. 7. The cross section 800 is taken along the line 745 shown in FIG. 7. In the illustrated embodiment, the LC filter is formed on a multilayer printed circuit board that acts as the filter substrate 805. For example, the substrate 805 can be formed out of multiple layers of a low loss Duroid material and may include a top layer 810, a bottom layer 870 that may have a ground plane 820 on its bottom side, and an internal layer 815 that bonds the upper and lower layers together. The thickness of layer 810 allows intermediate metal traces 845 to be positioned very close underneath one of the top layer traces, e.g. the vertical separation between traces in different layers is less than other horizontal dimensions of the structures formed within the layers. In the illustrated embodiment, a shunt capacitor 825 is formed in or on the top layer 810. For example, the shunt capacitor 825 may be a Hi Q Multilayer Ceramic capacitor that is deployed on the substrate 805 so that the plates 826, 827 of the capacitor 825 are in electrical contact with inductors 830.

Contacts 835, 840 may also be formed in or on the top layer 810. The contact 835 may form the output node of the filter 800 and may be connected to the inductive element 845 of the balun using via 850. As discussed herein, the coupling element 845 is formed under layer 810. The separation 855 between the shunt inductor 830 and the coupling element 845 may be determined by the thickness of the layer 810. The coupling element 845 may then be connected to the ground plane 820 using via 865. Alternatively, an "effective ground" can be created using the well-known property that a 90° transmission line left open at one end functions as an effective ground. Persons of ordinary skill in the art should appreciate that the traces and vias may be formed in the multilayer substrate 805 using well known processing techniques and in the interest of clarity these techniques will not be described in detail herein.

Figure 9:
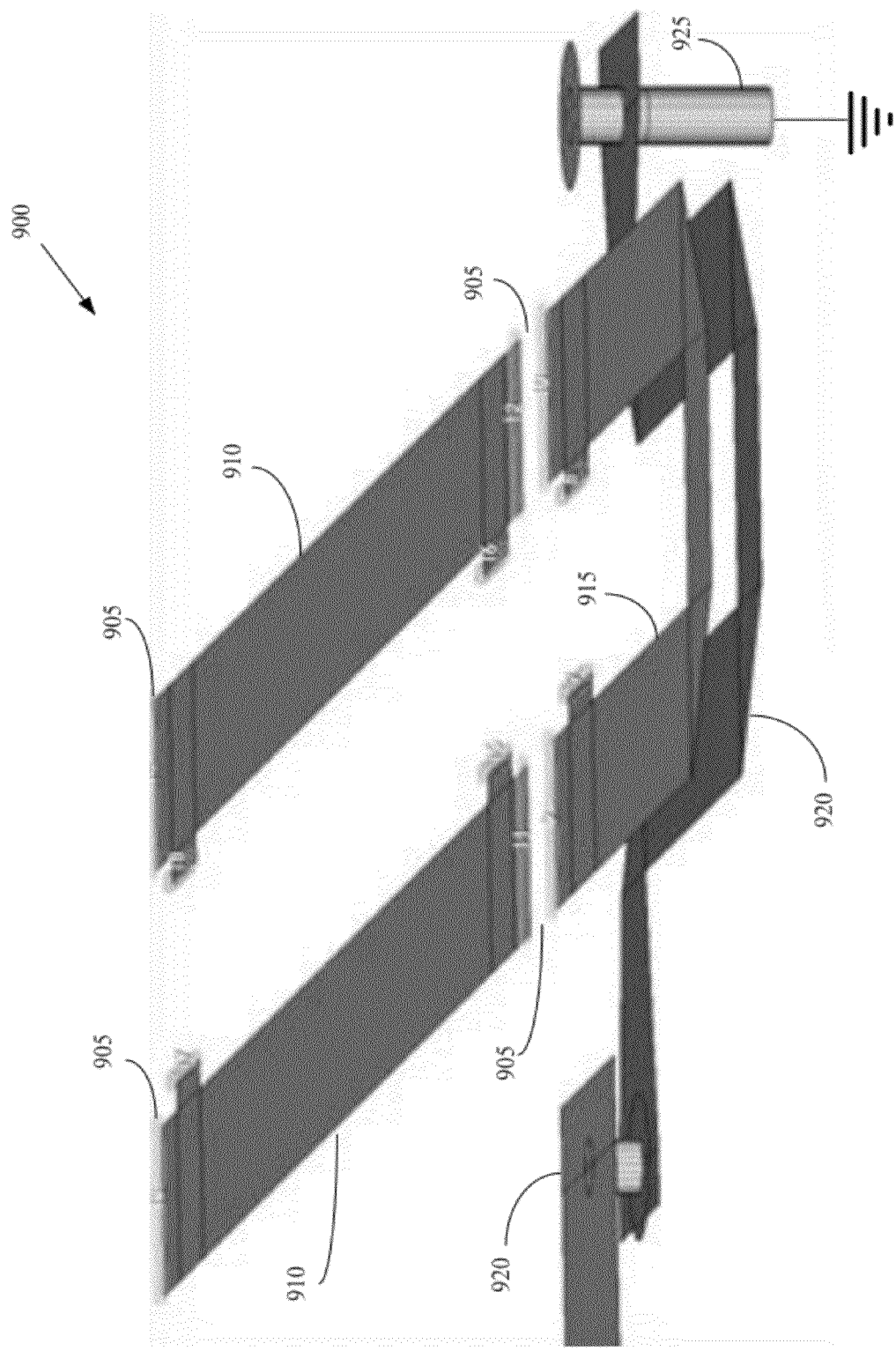
FIG. 9 shows a perspective view of one exemplary embodiment of a hybrid microstrip/LC filter without the capacitors showing.

FIG. 9 shows a perspective view of one end of an exemplary embodiment of an LC filter 900 with the capacitors removed to show just the metal traces. The filter 900 includes a short length of line to implement a shunt inductor 915 that is deployed over a coupling element 920 to form a built-in balun that converts the two-port input into a single output node 920. The coupling element 920 is connected to ground using via 925.

Embodiments of the filters depicted in FIGS. 6-9 are $3^{rd}$ order filters that use 3 resonators. However, persons of ordinary skill in the art having benefit of the present disclosure should appreciate that alternative embodiments may use different order filters and/or different numbers of resonators. For example, embodiments of the filters may be implemented as 5th order filters that may include an extra series resonator and an extra shunt resonator in the middle portion of the filter. These alternative embodiments may be implemented as a hybrid LC/Microstrip reconstruction filter with an integrated balun.

Figure 10:
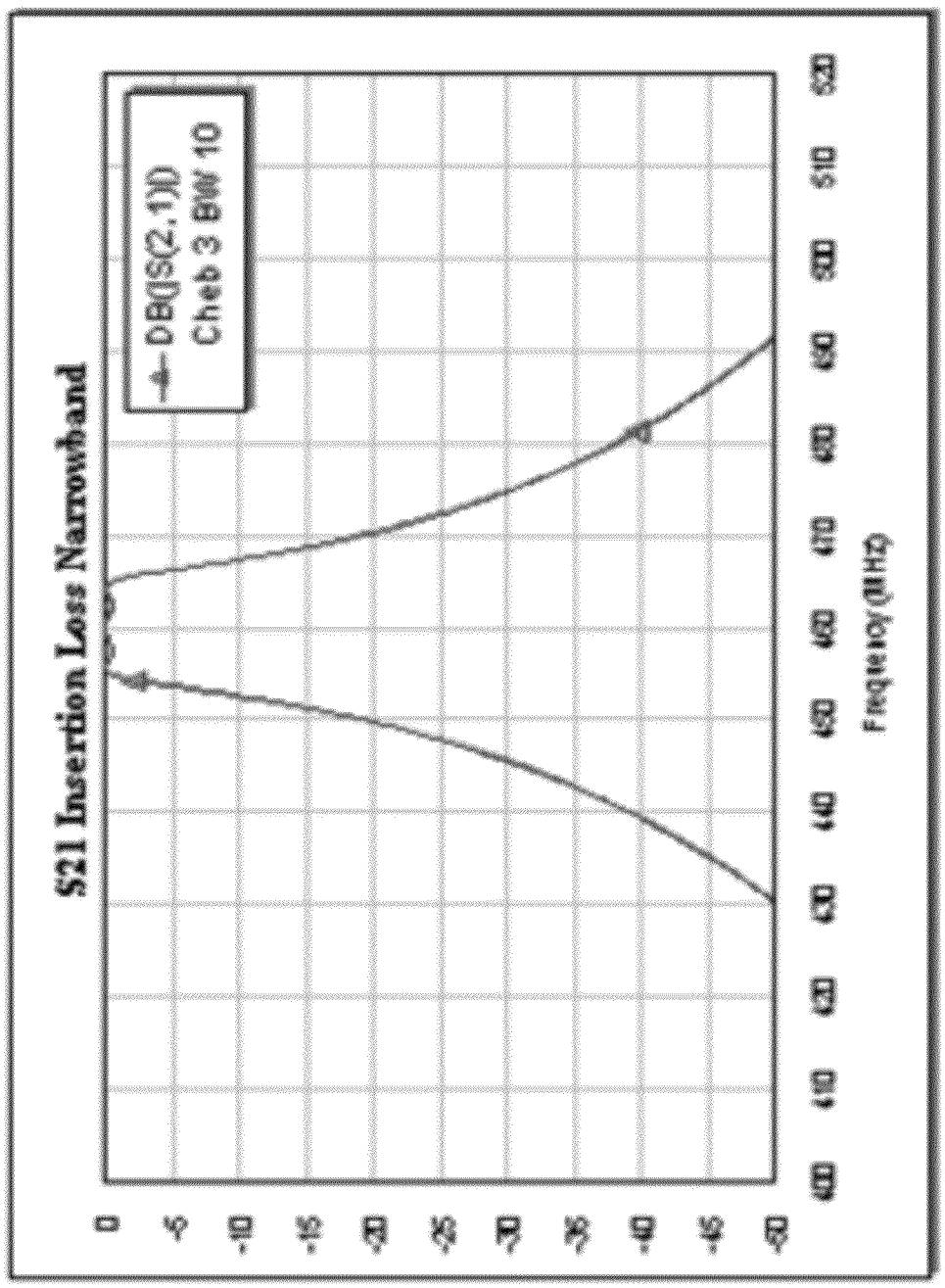
FIG. 10 illustrates the frequency response of one exemplary embodiment of an LC filter such as the embodiments depicted in FIGS. 6-9.

FIG. 10 illustrates the frequency response of one exemplary embodiment of an LC filter such as the embodiments depicted in FIGS. 6-9. The horizontal axis of FIG. 10 indicates the frequency in megahertz and the vertical axis indicates the insertion loss in decibels relative to the insertion loss at the center of the passband of the filter. In the illustrated embodiment, the bandwidth of the filter is centered on a frequency of 460 MHz and has a bandwidth of approximately 10 MHz that extends from approximately 455 MHz to 465 MHz. The filter response drops rapidly at frequencies above and below the bandwidth and reaches an insertion loss of −50 dB at 430 MHz and 490 MHz.

Figure 11:
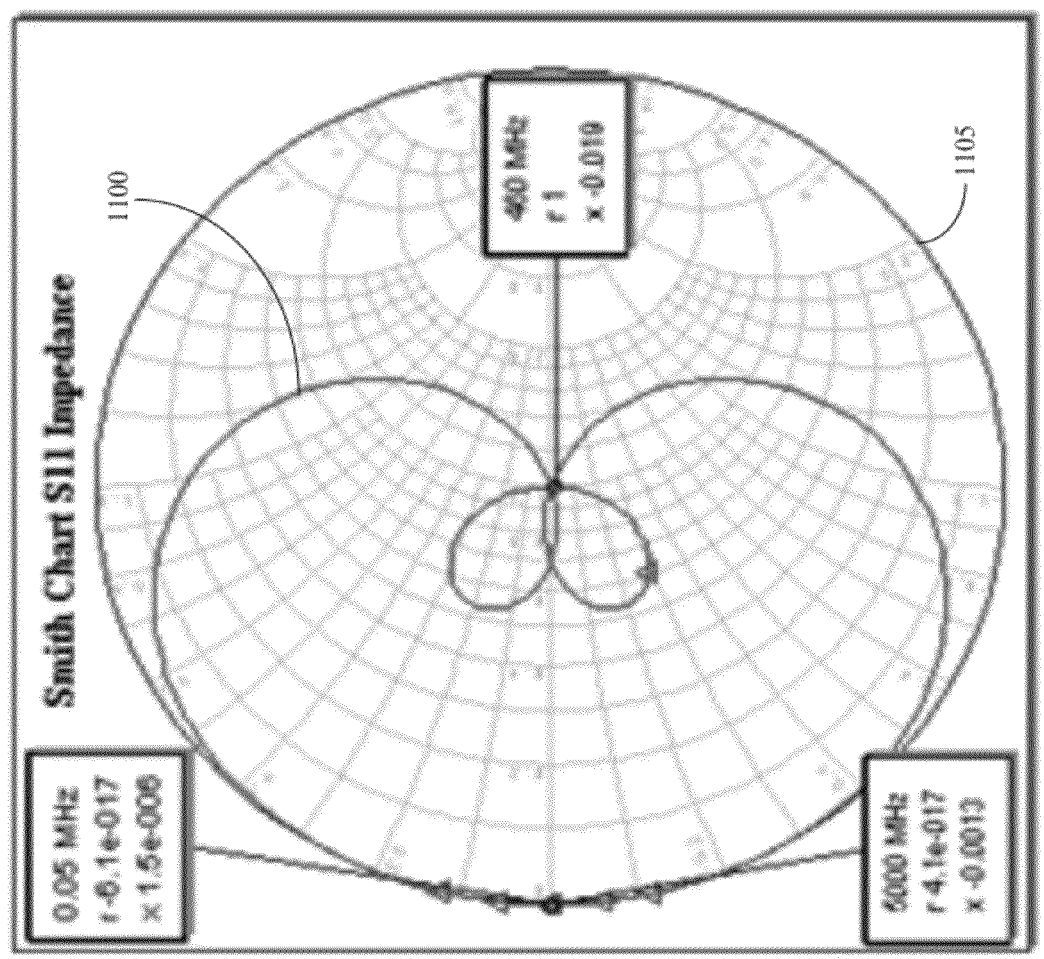
FIG. 11 depicts a Smith chart for the impedance of the exemplary embodiment of the LC filter having the frequency response shown in FIG. 10.

FIG. 11 depicts a Smith chart for the impedance of the exemplary embodiment of the LC filter having the frequency response shown in FIG. 10. The impedance of the LC filter is shown as a function of frequency by the line 1100. The line 1100 loops about the center of the Smith chart for frequencies in the bandwidth of the LC filter, which indicates that the LC filter is matched to the port impedance around the center frequency of 460 MHz. The LC filter therefore preferentially transmits signals at these frequencies. The line 1100 approaches the unit circle boundary 1105 at the left edge of the Smith chart at frequencies above and below the passband of the LC filter. For example, the line 1100 ends at frequencies of 0.05 MHz and 5000 MHz. At these frequencies, the line 1100 is at the left edge of the unit circle boundary 1105. Persons of ordinary skill in the art having benefit of the present disclosure should appreciate that the impedances on the left edge of the unit circle boundary of the Smith chart indicate that the LC filter is providing a short to ground at frequencies out of the passband of the filter rather than for example other parts of the unit circle such as the right edge which would represent an open. The exemplary embodiment of the LC filter is therefore shorting out-of-band radiofrequency signals to ground and is not using arbitrary high reflection coefficient impedances to reflect the high and low frequency noise. Consequently, the LC filter may not increase or exacerbate the energy dissipated in other portions of an amplifier circuit in a Class-S amplifier.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A filter, comprising:
    first and second input nodes for receiving balanced signals;
    an inductive-capacitive (LC) circuit coupled between the first and second input nodes and first and second intermediate nodes, wherein the LC circuit comprises a first shunt LC resonator coupled between the first and second input nodes, a second shunt LC resonator coupled between the first and second intermediate nodes, and a plurality of capacitors and inductors between the first and second shunt LC resonators; and
    a coupling circuit that couples the first and second intermediate nodes to an output node, wherein balanced signals within a filter bandwidth are transmitted from the first and second input nodes to the output node and balanced radiofrequency signals outside the filter bandwidth are substantially shorted to ground;

wherein the coupling circuit comprises at least one of shunt or series inductors and a coupling element between the output node and an effective ground; and wherein said at least one of the plurality of shunt inductors and said at least one coupling element are formed using metal traces that are separated from each other by a selected distance.

2. The filter of claim 1, wherein the metal traces are deployed one over the other and are separated from each other by a selected distance in a vertical direction.

3. The filter of claim 1, wherein the metal traces are deployed in substantially the same plane and are separated from each other by a selected distance in a horizontal direction.

4. The filter of claim 1, wherein inductors in the LC circuit are formed using metal traces and wherein capacitors in the LC circuit are multilayer ceramic capacitors.

5. The filter of claim 4, comprising a multilayer printed circuit board, and wherein the metal traces and ceramic capacitors are formed in layers of the multilayer printed circuit board.

* * * * *